United States Patent
Lan et al.

(10) Patent No.: US 8,709,891 B2
(45) Date of Patent: Apr. 29, 2014

(54) METHOD AND SYSTEM FOR UTILIZING PEROVSKITE MATERIAL FOR CHARGE STORAGE AND AS A DIELECTRIC

(71) Applicants: Zhida Lan, San Jose, CA (US); Dongmin Chen, Fremont, CA (US)

(72) Inventors: Zhida Lan, San Jose, CA (US); Dongmin Chen, Fremont, CA (US)

(73) Assignee: 4D-S Ltd., Perth (AU)

(*) Notice: Subject to any disclaimer, the term of this patent is extended or adjusted under 35 U.S.C. 154(b) by 0 days.

(21) Appl. No.: 13/918,537

(22) Filed: Jun. 14, 2013

(65) Prior Publication Data
US 2013/0279236 A1 Oct. 24, 2013

Related U.S. Application Data

(63) Continuation of application No. 13/446,981, filed on Apr. 13, 2012, now abandoned, which is a continuation of application No. 13/500,301, filed as application No. PCT/US2011/030382 on Mar. 29, 2011.

(60) Provisional application No. 61/318,684, filed on Mar. 29, 2010.

(51) Int. Cl.
*H01L 21/8242* (2006.01)

(52) U.S. Cl.
USPC ............ 438/241; 438/3; 438/190; 438/210; 438/240; 438/329

(58) Field of Classification Search
USPC ............ 438/3, 171, 190, 210, 238–253, 329, 438/379, 387, 444, 785, 901, FOR. 430; 257/2, 3, 4, 5, 295; 365/145, 148, 149
See application file for complete search history.

(56) References Cited

U.S. PATENT DOCUMENTS

| | | | | |
|---|---|---|---|---|
| 4,873,664 A | * | 10/1989 | Eaton, Jr. | 365/145 |
| 6,373,743 B1 | * | 4/2002 | Chen et al. | 365/145 |
| 7,122,851 B2 | * | 10/2006 | Itokawa et al. | 257/295 |
| 2003/0151941 A1 | * | 8/2003 | Salling | 365/145 |

* cited by examiner

*Primary Examiner* — Alexander Sofocleous
*Assistant Examiner* — Joannie A Garcia

(57) ABSTRACT

Memory devices and methods for providing the memory devices are provided. The memory devices utilize multiple metal oxide layers. The methods for providing the memory devices can include providing a transistor; producing a capacitor that includes metal layers and metal oxide layers; connecting the capacitor to a side of the transistor; and providing a wordline, bitline, and driveline through connection with the transistor or the capacitor.

10 Claims, 10 Drawing Sheets

METHOD AND SYSTEM FOR UTILIZING PEROVSKITE MATERIAL FOR CHARGE STORAGE AND AS A DIELECTRIC

CROSS-REFERENCE TO RELATED APPLICATION

Under 35 USC §120 this application is a continuation application of U.S. patent application Ser. No. 13/446,981 filed Apr. 13, 2012, which is a continuation application of U.S. patent application Ser. No. 13/500,301, filed Apr. 4, 2012, entitled "Method and System for Utilizing Perovskite Material for Charge Storage and as a Dielectric," which is a US National Stage Application of International Application No. PCT/US2011/030382, filed Mar. 29, 2011, entitled "Method and System for Utilizing Perovskite Material for Charge Storage and as a Dielectric," which claims the benefit of U.S. provisional patent application Ser. No. 61/318,684, filed Mar. 29, 2010. Present application is related to Application No. 61/234,183, entitled "Heterojunction Oxide Non-Volatile Memory Device," filed Aug. 14, 2009, and Application Number PCT/US 2010/045667, entitled, "Heterojunction Oxide Non-Volatile Memory Device," filed on Aug. 16, 2010, all of which are incorporated by reference herein.

FIELD OF THE INVENTION

The present invention relates generally to memory devices, and more particularly to a memory device that includes heterojunction oxide material.

BACKGROUND OF THE INVENTION

As Moore's Law has been predicting, the capacity of memory cells on silicon for the past 15-20 years has effectively doubled each year. Moore's Law is that every year the amount of structures or gates on a silicon wafer will double, but the price will essentially stay the same. And in some cases, the price will even erode. As these memory cells continue to shrink, the technology is starting to reach a barrier know as the quantum limit, that is, they are actually approaching molecular boundaries, so the cells cannot get any smaller.

Disk drives have been the dominant prime storage in terms of peak capacity, because storing individual domains (magnetic transition sites) on the disk drives unlike semiconductor memory cells disk memory sites do not require connections to get in and out of those domains. Now, in recent history, semiconductor resolutions apply feature geometries with 90 nanometer feature resolutions progressing to 45 and 25 nanometer feature size sizes, with these feature capabilities, the memory cell size, and chip capacity equation changes. Furthermore, certain semiconductor memory technologies have applied a principal of geometric redundancy, where a multiple of data bits may be stored in a single cell. This property of a memory cell to support a multiple of values is sometimes referred to as its dynamic range. To date, memory cells have abilities to support a dynamic range anywhere between 1 and 4 bits, which provides multiples of storage per memory cell. These combined properties of semiconductors have increased capacities and costs, and they are now able to directly compete with disk drives.

Another issue associated with semiconductor memory manufacturing has been the substantial costs of the semiconductor foundries which can run up to more than a billion dollars to establish with amortizing expenses, thereby inflating the unit cost of memory chips. In recent history, this represented price barriers compared with cost per capacity of a disk drive file. Now, with advances in foundry resolutions enabling smaller cell sizes and the geometric redundancy of multiple bit-level per memory cell semiconductor memory is actually cheaper per unit cost, and substantially more rugged in terms of high G forces than memory files on a disk drive.

In Flash memories, there have been improvements in the Moore's Law effect but that has become a diminishing proposition because as the cells started getting smaller and smaller, write cycle limitations and ability to support dynamic ranges are diminished.

So basically, as characterized in recent press review, Flash memory is hit the proverbial wall in increasing data capacity per unit cost, as the quantum limit is approached.

But another issue with Flash memory is its limitations in write speeds. In order to compete with disk drive performance, the memory cells word structure is configured to switch in parallel. Another issue is the number of write cycle limitations the cell will tolerate before it permanently fails. Prior to the substantial reduction in cell size, it was approximately in the range of one million, however, as the foundry feature size resolutions reduced in size, rewrite cycle diminished to approximately 100,000 write cycles. For most non-prime storage applications that may be practical. However, for SRAM and DRAM applications where you're actually exchanging data at substantial repetition rates, several times per microsecond.

Accordingly, what is desired is a memory system and method which overcomes the above-identified problems. The system and method should be easily implemented, cost effective and adaptable to existing storage applications. The present invention addresses such a need.

SUMMARY OF THE INVENTION

A memory is disclosed. In a first aspect the memory comprises a first doped well; two wells of opposite doping implanted in the first doped well; and two bitlines located on top of the two wells. The memory includes a Perovskite material on top of the first doped well and located between two bitlines; and a wordline located above the Perovskite material.

In a second aspect the memory comprises a first doped well; two wells of appropriate doping implanted in the first doped well; and two bitlines located on top of the two wells. The memory includes a Perovskite material located within one of the bitlines and a wordline located above the first dopedwell and located between the two bitlines.

DETAILED DESCRIPTION

The present invention relates generally to memory devices, and more particularly to a memory device that includes a heterojunction oxide material. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention is directed to a memory device. The memory device can be utilized in a variety of applications from a free standing nonvolatile memory to an embedded device in a variety of applications. These applications include but are not limited to embedded memory used in a wide range of SOC (system on chip), switches in programmable or configurable ASIC, solid state drive used in computers and servers, memory sticks used in mobile electronics like camera, cell phone, Ipod etc. More particularly, many of the embodiments disclosed herein will include PCMO as one of the metal oxide layers. It is well understood by one of ordinary skill in the art that the present invention should not be limited to this metal oxide layer or any other layer disclosed herein. The key element is that the formation of the first metal oxide layer has a Gibbs free energy that is lower than the Gibbs free energy for the formation of the second metal oxide layer.

Figure 1:
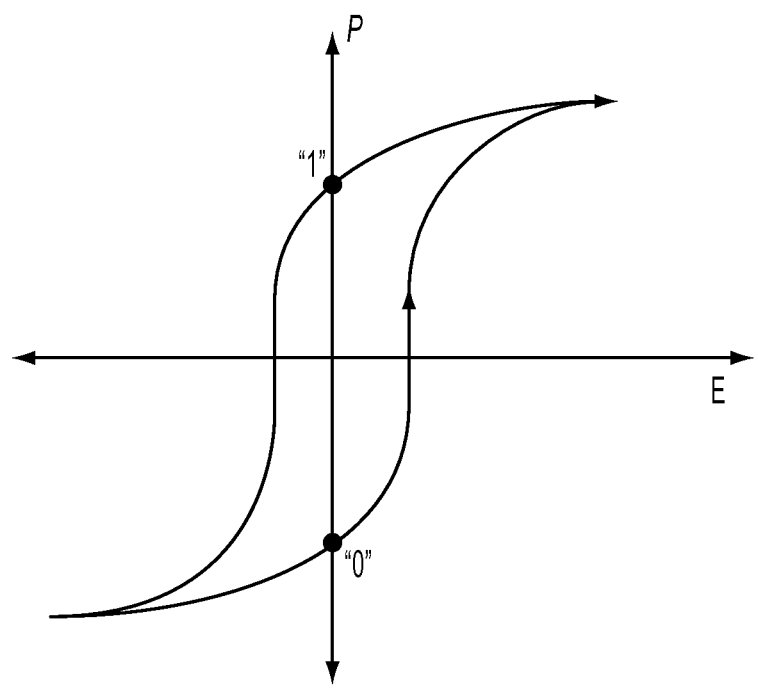
FIG. 1 illustrates hysteresis polarization of a memory which includes a ferroelectric material.

Perovskite material, such as PCMO, has a ferroelectric property. That means the polarization of the material has a hysteresis effect as shown in FIG. 1. The hysteresis effect is due to electric dipoles formed by aligning charge against external field.

This type of material can utilized as part of a NAND/NOR type memory or a DRAM memory. To describe each of these uses in more detail refer now to the following description in conjunction with the accompanying drawings.

NAND/NOR Type Memory

Figure 2:
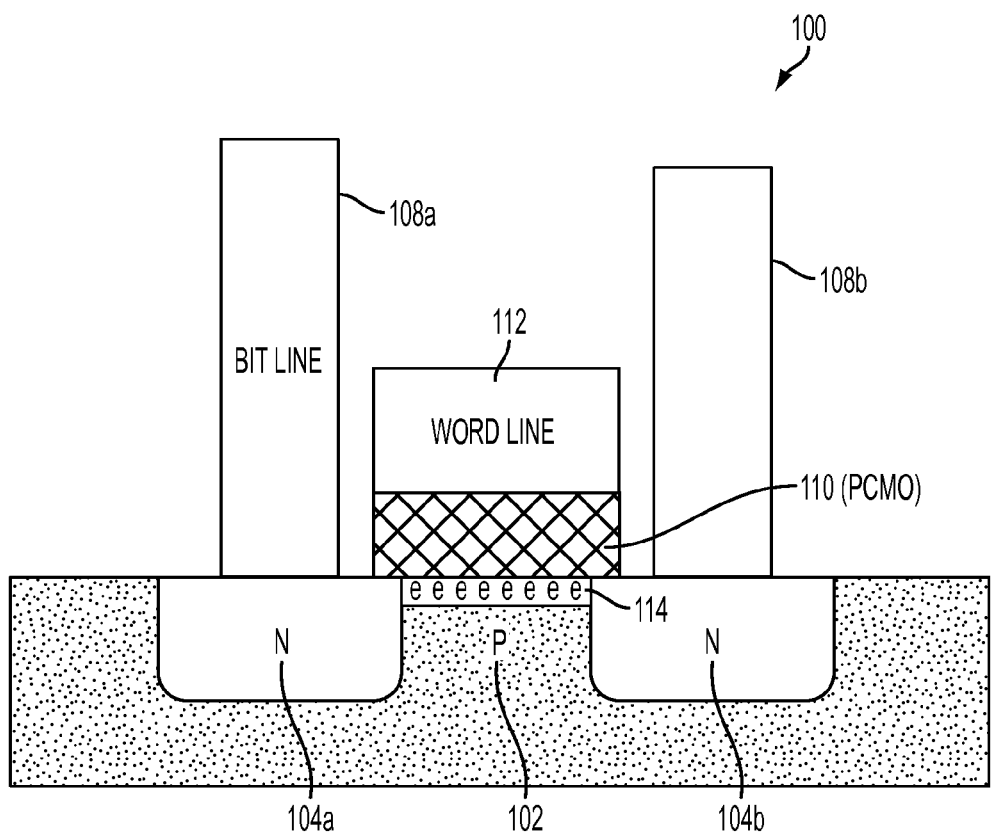
FIG. 2 is a diagram of a memory in accordance with the present invention.

In this embodiment, the Perovskite material is used to replace a charge trap layer such as SixN (or float gate) in a typical NAND/NOR memory. FIG. 2 is a diagram of one embodiment of a memory 100 in accordance with the present invention. The memory includes a Pwell 102 and two Nwells 104 implanted therein. Bitlines 108a and 108b are provided on top of the Nwells 104. A PCMO layer 110 is provided over the Pwell 102 between the two Nwells 104a and 104b. A PCMO layer 110 that could be utilized in memory 100 is disclosed in PCT Patent Application PCT/US 2010/045667, entitled "Heterojunction Oxide Non-Volatile Memory Device," and assigned to the assignee of this application. A wordline 112 is provided over the PCMO 110.

One of ordinary skill in the art readily recognizes that the device can be in a different configuration and that would be within the spirit and scope of the present invention. Accordingly the memory device could include a Nwell with two Pwells implanted therein and that would be within the spirit and scope of the present invention. The advantage of this type of memory is lower program/erase voltage (−5V or less) (compared with >10V of conventional technology), faster (<100 ns) (compared with 10 us or more for conventional method). In addition, an extra layer can be added between PCMO 110 and conduction channel 114 to prevent charge flow through gate. To describe the operation of the memory 100 refer now to the following description in conjunction with the accompanying Figures.

Program

Figure 2A:
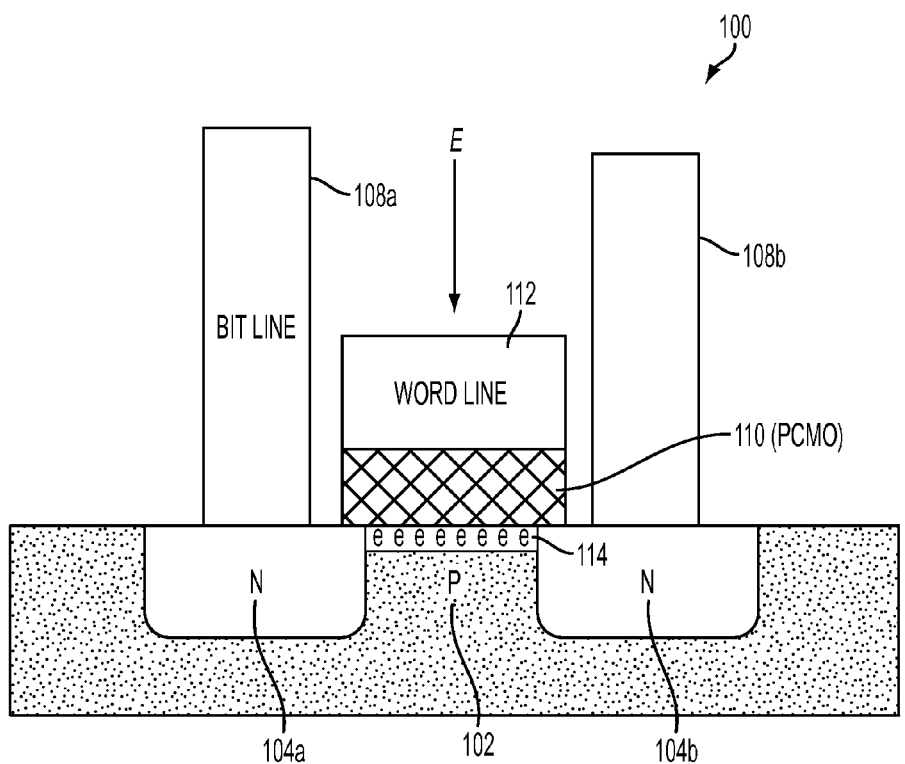
FIG. 2A illustrates programming the memory of FIG. 2.

Programming the device 100 is described in conjunction with FIG. 2A. A magnetic field is applied from the gate that can induce a dipole in PCMO layer 110. The dipole can be induced by adding a positive voltage say 5V at the gate and the ground substrate. Therefore the threshold voltage (Vt) of the memory 100 is reduced.

Erase

Figure 2B:
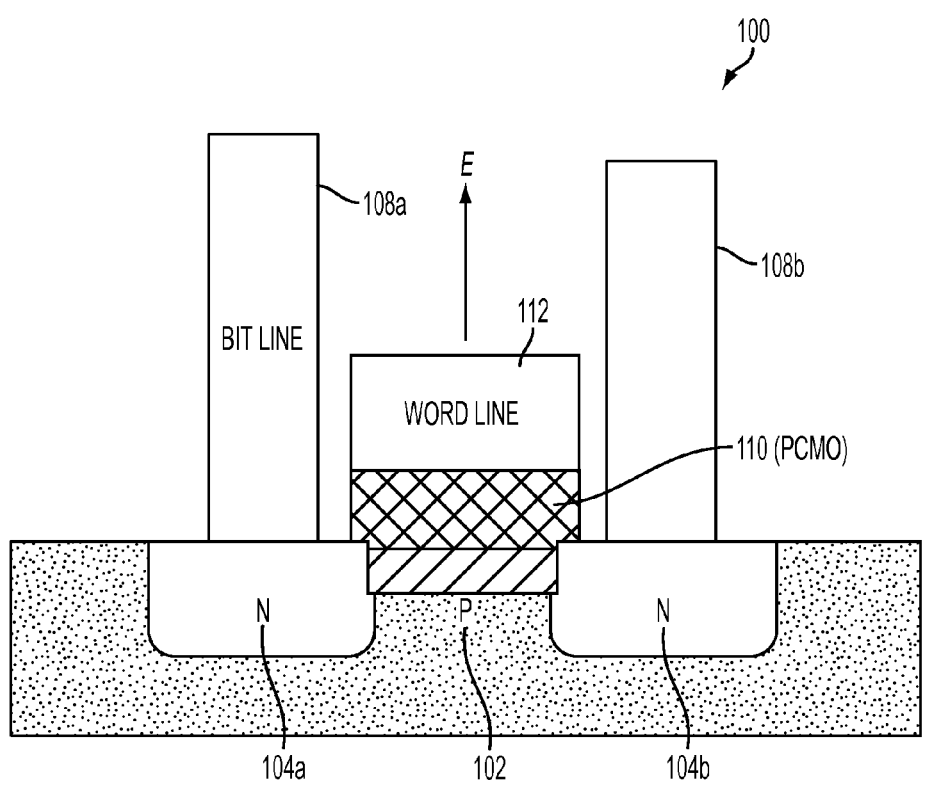
FIG. 2B illustrates erasing data from the memory of FIG. 2.

Erasing data from the device 100 is described in conjunction with FIG. 2B. During erasure a negative magnetic field from the gate is applied that can reduce the dipole in PCMO layer 110. Therefore the threshold voltage (Vt) of the memory 100 is increased.

Read

Figure 2C:
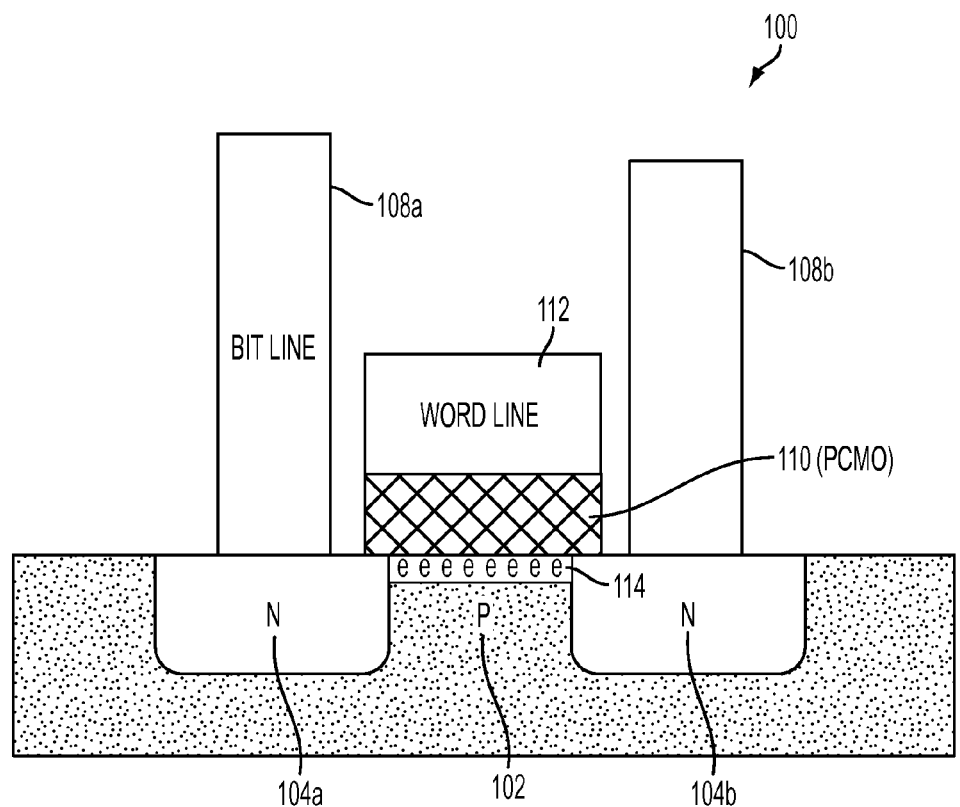
FIG. 2C illustrates reading data from the memory of FIG. 2.

Reading data from the memory 100 is described in conjunction with FIG. 2C. The memory is read by sensing current at a drain with smaller gate voltage Vg (for example 2V), and drain voltage Vd (for example 1.2V). The drain current Id indicates the state of the device. Higher current (smaller Vt) may be defined as state "1", otherwise, it is state "0". The device is read by sensing current at the drain with smaller gate voltage Vg, and drain voltage Vd.

Ferroelectric Memory

Figure 3:
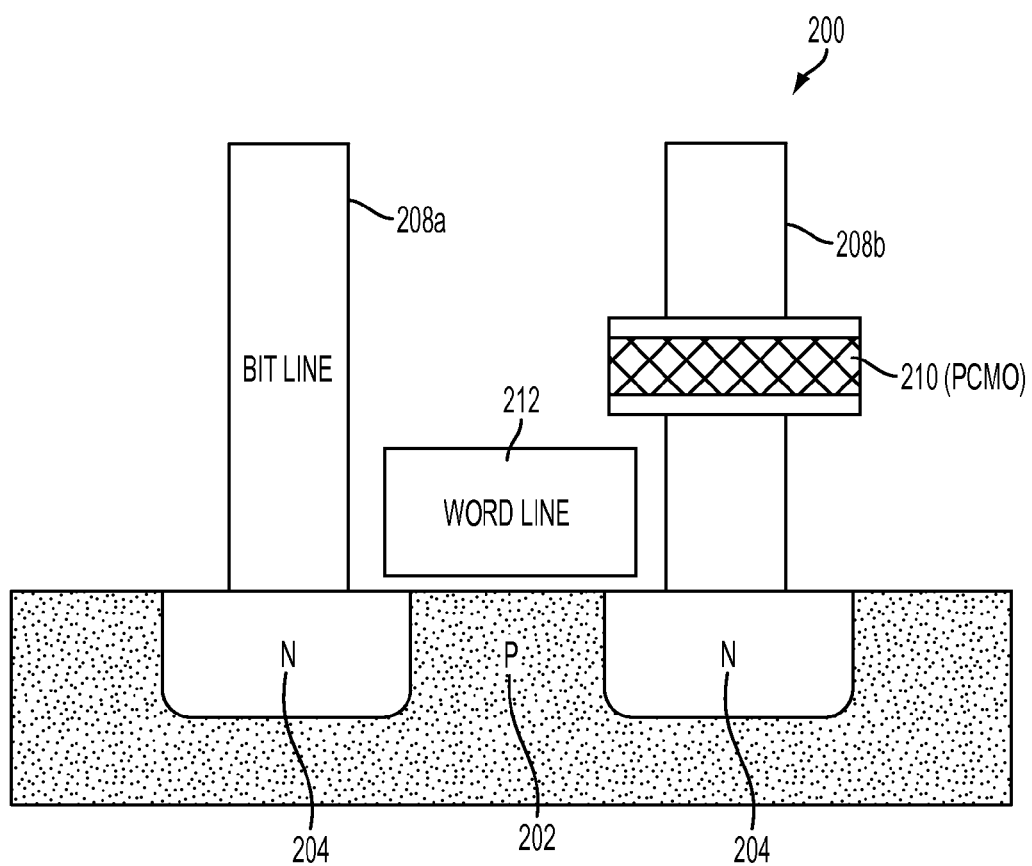
FIG. 3 is a diagram of wherein the Perovskite material is used as a dielectric material in a capacitor in a memory.

FIG. 3 is a diagram of wherein the Perovskite material is used as a dielectric material in a capacitor in a Ferroelectric memory 200. The memory 200 includes a Pwell 202 and two Nwells 204 implanted therein. Bitlines 208a and 208b are provided on top of the Nwells 104. A PCMO layer 210 is provided within the bitline 208b. A PCMO layer 210 that could be utilized in memory 200 is disclosed in PCT Patent Application PCT/US 2010/045667, entitled "Heterojunction Oxide Non-Volatile Memory Device," and assigned to the assignee of this application. A wordline 212 is provided over the Pwell 202 between the bitlines 208a and 208b. One of ordinary skill in the art readily recognizes that the device can be in a different configuration and that would be within the spirit and scope of the present invention.

Accordingly, the memory device could include a Nwell with two Pwells implanted therein and that would be within the spirit and scope of the present invention. The advantage of this type of memory 200 is much longer data retention to reduce refresh than in a conventional DRAM/SRAM, therefore significantly improving energy efficiency.

The memory cell 200 is quite similar to a conventional DRAM cell. Both cells use the wordline and the bitline with the same topology. The only difference between the two cells is the driveline in the memory 200 that does not exist in the DRAM cell. The function of each line during the write/read operations of the memory 200 is described in the following description in conjunction with the accompanying figure.

Figure 4:
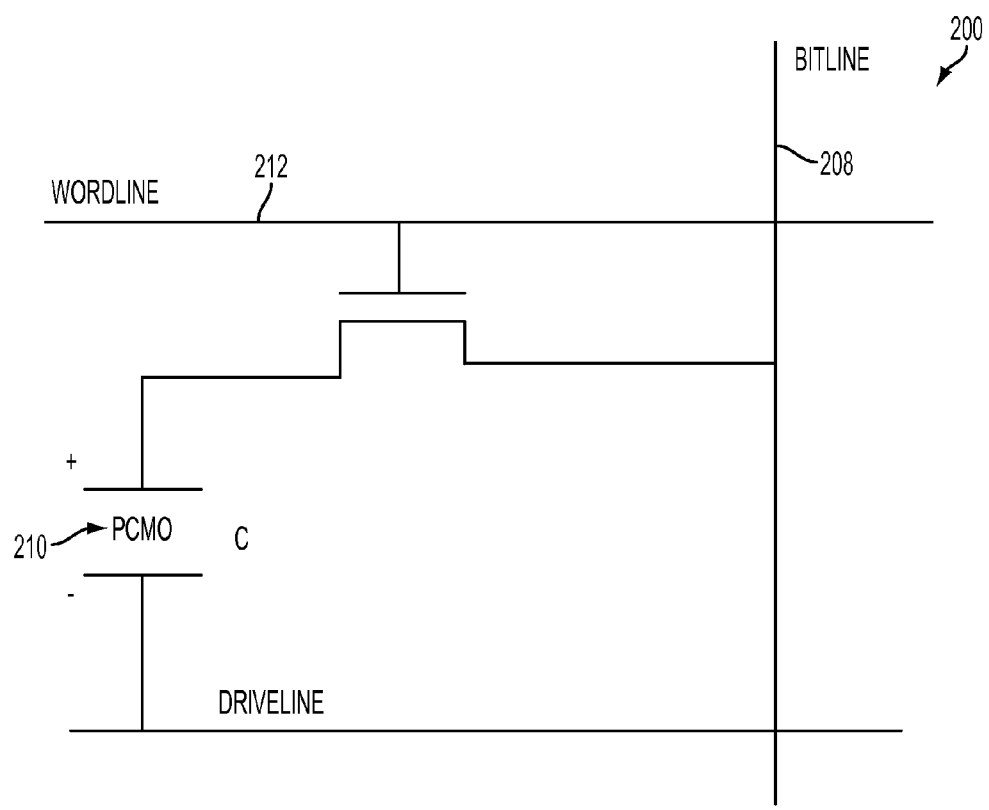
FIG. 4 is a circuit diagram of the memory of FIG. 2.

FIG. 4 is a circuit diagram of the memory 200. In order to write a binary digit 0 (positive polarization state) to the memory, a positive voltage (normally the full power supply voltage, VDD) is applied to the bitline while the driveline is grounded and the wordline is asserted. In writing a binary digit 1 (negative polarization state), a positive voltage (VDD) is applied to the driveline while the bitline is grounded and the wordline is asserted. Note that a negative voltage would be required on the bitline to produce the same voltage across the PCMO capacitor if the driveline were grounded. Also note that the equivalent circuit in the write operation is the PCMO capacitor in series with the access transistor ON resistance. Consequently, there is an effective time constant that limits the writing speed.

The memory 200 can be read by floating the bitline and applying a positive voltage (VDD) to the driveline while asserting the wordline. If the initial polarization state of the capacitor is negative (positive), reading the memory develops a relatively large (small) signal on the bitline. Since this operation is destructive, the data must be written back into the cell after each read (data restore). The equivalent circuit in the read operation is the PCMO capacitor in series with the bitline capacitor. Therefore, the capacitance ratio of the bitline to the PCMO capacitor determines the available voltage for polarization switching of the PCMO capacitor. A ratio of 2:1 is normally suggested for 5V power supply operation. Higher ratios will provide larger voltage for the polarization switching but, at the same time, reduces the voltage available for sensing.

Figure 5A:
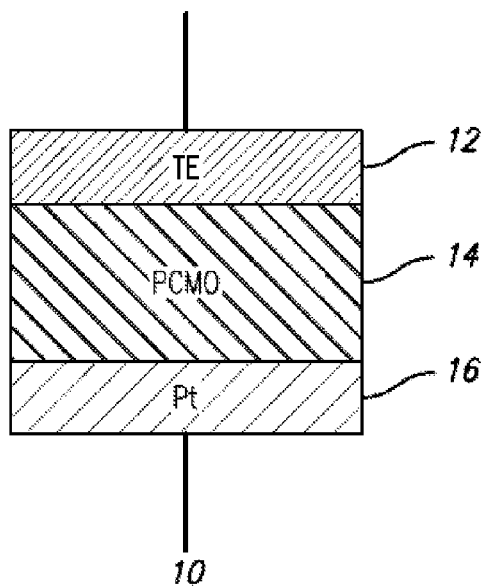
FIGS. 5A and 5B show illustrations of an exemplary memory device or a capacitor portion of a memory device that can be utilized as a memory.
Figure 5B:
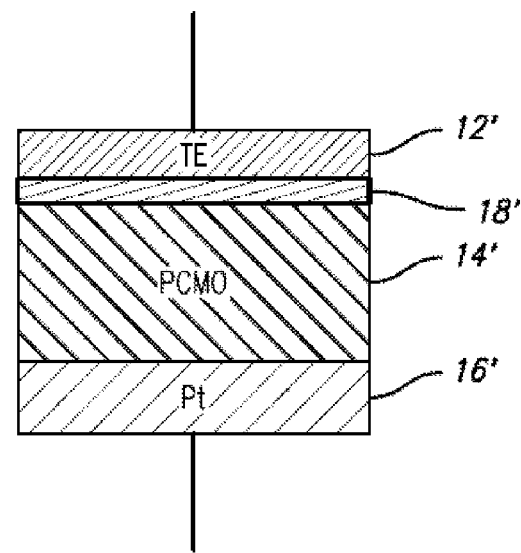

FIG. 5A is an illustration of a memory device 10 which includes a Platinum (Pt) bottom electrode 16, which in turn is coupled to a Praseodymium Calcium Manganese Oxide (PCMO) layer 14 which in turn is coupled to a top electrode 12 which is made of a metal. If a Gibbs free energy for the formation of oxidation of the top electrode 12 is less (more negative) than a Gibbs free energy for the formation of oxidation of the PCMO layer 14, the top electrode metal will spontaneously form a thin metal oxide 18 at the interface as shown in FIG. 5B. This second metal oxide layer 18 is preferably thinner than the first oxide layer 14.

Figure 6A:
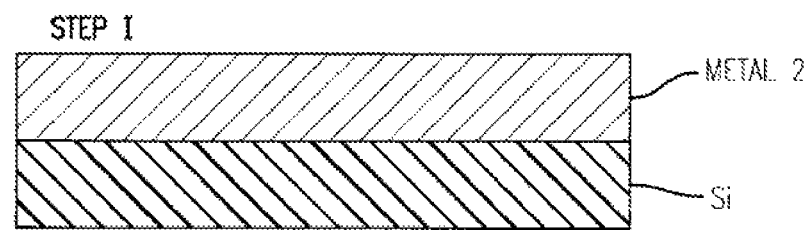
FIG. 6A illustrates providing metal on a silicon surface.
Figure 6B:
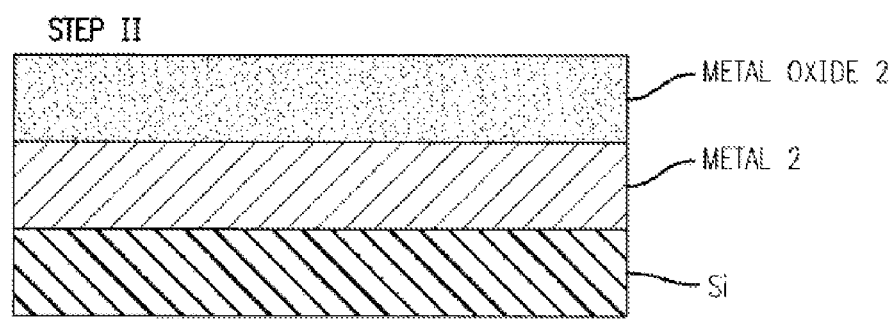
FIG. 6B illustrates sputtering metal oxide onto a metal surface.
Figure 6C:
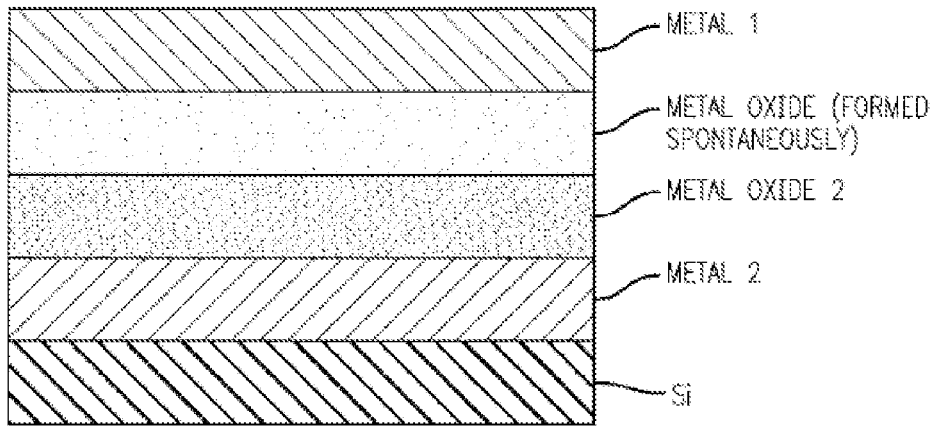
FIG. 6C illustrates a second metal oxide forming spontaneously by providing a metal of the right energy level onto a first metal oxide.
Figure 6D:
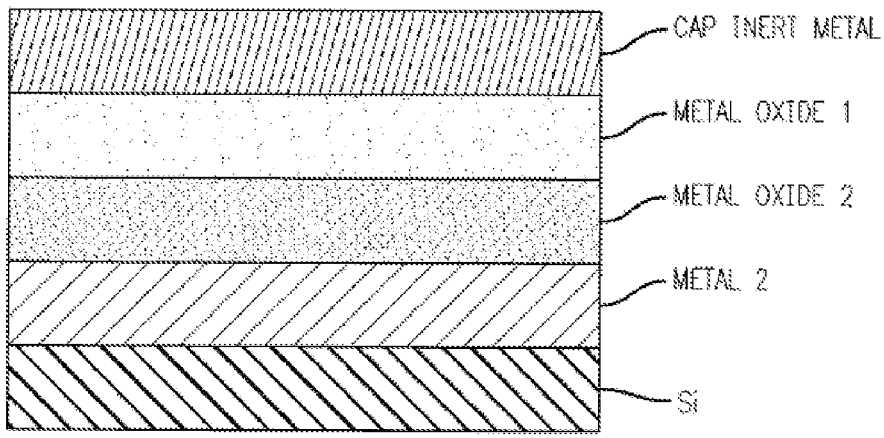
FIG. 6D illustrates a second metal oxide sputtered onto a first metal oxide surface, and an inert metal is provided on top of the second metal oxide.

FIGS. 6A-6D illustrate the process of producing such a device. FIG. 6A illustrates providing the metal 2 on a silicon surface. FIG. 6B illustrates sputtering metal oxide 2 onto the metal 2 surface. The next step is one of two alternative processes. Firstly, as seen in FIG. 6C, metal oxide 1 is formed spontaneously by providing metal 1 on the metal oxide 2, where the metal 1 has a lower oxidation free energy than that of metal 2 so that metal oxide 1 can be formed spontaneously between metal 1 and metal oxide 2. As an alternative as shown in FIG. 6D, the metal oxide 1 is sputtered on to the metal oxide 2 surface, and an inert metal is provided on top of the metal 1 oxide.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

The invention claimed is:

1. A method for providing a memory, comprising
providing a transistor;
producing a capacitor by:
    providing a first metal layer;
    sputtering a first metal oxide layer onto the first metal layer; and
    providing a second metal oxide layer and a second metal layer on the first metal oxide layer;
connecting the capacitor to a side of the transistor;
providing a wordline, connected to a gate of the transistor;
providing a bitline, connected to a side of the transistor not connected to the capacitor; and
providing a driveline, connected to the capacitor,
wherein Gibbs free energy for formation of the second metal oxide layer is lower than Gibbs free energy for formation of the first metal oxide layer.

2. The method of claim 1, comprising
writing the memory by:
applying a positive voltage to the bitline;
connecting the driveline to ground; and
asserting the wordline.

3. The method of claim 1, comprising
writing the memory by:
applying a positive voltage to the driveline;
connecting the bitline to ground; and
asserting the wordline.

4. The method of claim 1, comprising
reading the memory by:
floating the bitline;
applying a positive voltage to the driveline; and
asserting the wordline.

5. The method of claim 1, wherein the providing of the second metal oxide layer and the second metal layer comprises:
providing the second metal layer on the first metal oxide layer,
wherein, upon providing the second metal layer, the second metal oxide layer forms spontaneously between the second metal layer and the first metal oxide layer.

6. The method of claim 1, wherein the providing of the second metal oxide layer and the second metal layer comprises:
sputtering the second metal oxide layer onto the first metal oxide layer; and
providing the second metal layer on top of the second metal oxide layer.

7. The method of claim 6, wherein the second metal layer is an inert metal.

8. The method of claim 6, wherein the second metal oxide layer comprises a different metal than the second metal layer.

9. The method of claim 1, wherein the first metal oxide layer is a Perovskite material.

10. The method of claim 9, wherein the Perovskite material is a PCMO layer.

* * * * *